United States Patent [19]

Flanner, et al.

[11] Patent Number: 5,021,358

[45] Date of Patent: Jun. 4, 1991

[54] SEMICONDUCTOR FABRICATION PROCESS USING SACRIFICIAL OXIDATION TO REDUCE TUNNEL FORMATION DURING TUNGSTEN DEPOSITION

[75] Inventors: Janet M. Flanner, Union City; Michelangelo Delfino, Los Altos, both of Calif.

[73] Assignee: North American Philips Corp. Signetics Division, Sunnyvale, Calif.

[21] Appl. No.: 277,475

[22] Filed: Nov. 23, 1988

Related U.S. Application Data

[63] Continuation of Ser. No. 50,598, May 14, 1987, abandoned.

[51] Int. Cl.$^5$ .................... H01L 21/335; H01L 21/285
[52] U.S. Cl. .................................. 437/57; 437/192; 437/41; 437/239; 437/946
[58] Field of Search ............... 437/192, 245, 246, 195, 437/56, 57, 58, 34, 41, 239, 985, 946; 148/DIG. 17, DIG. 20

[56] References Cited

U.S. PATENT DOCUMENTS 3,945,856  3/1976  Koenig et al. ................... 148/1.5
4,330,931  5/1982  Liu ..................................... 437/192
4,622,735  10/1989 Shibata ............................. 437/200

OTHER PUBLICATIONS

Metz et al., "Effect of Selective. . . ", *IEEE Electron Device Letter.*, Jul. 1985, pp. 372–374.
DeBlasi et al., "Interfacial Tunnel. . . ", *Mat. Res. Soc. Symposium* Presented Apr. 1986, Pub. in Mat. Res. Soc. Symp. Proc., vol. 71, 1986, pp. 303–307.
Stacy et al., "Interfacial Structure. . . ", *J. Electrochem. Soc.*, Feb. 1985, pp. 444–448.
Paine et al., "Microstructural. . . ", *Mat. Res. Soc. Workshop* Oct. 1985, Pub. in *Tungsten and Other Ref. Metals of VLSI*, 1986, pp. 117–123.
Itsumi et al., "Origin and Elimination. . .", *Appl. Phys. Lett.*, 15 Mar. 1982, pp. 496–498.
Prussin, "Role of Sequential. . . ", *J. Appl. Phys.*, Apr. 1974, pp. 1635–1642.
Broadbent et al., "Selective Low. . . ", *J. Electrochem*, Jun. 1984, pp. 1427–1433.
Saraswat et al., "Selective CVD. . . ", *VLSI Sci & Tech.*, 1984, vol. 84–87, pp. 409–419.
Delfino et al., "Boron Implantation. . . ", *IEEE Elect. Dev. Lett.*, Jul. 1985, pp. 338–340.
Green et al., "Structure of Selective. . . ", *J. Electrochem. Soc.*, May 1985, pp. 1243–1250.
Levy et al., "Selective LPCVD Tungsten," *J. Electrochem Soc.*, Sep. 1986, pp. 1905–1912.
Nakajima et al., "Defects in a Gate Oxide", *Japanese J. Appl. Phys.* May 1979, pp. 943–951.

*Primary Examiner*—Brian E. Hearn
*Assistant Examiner*—T. N. Quach
*Attorney, Agent, or Firm*—T. Briody; A. Tamoshunas; R. Meetin

[57] ABSTRACT

A method of fabricating a CMOS-type structure entails forming a pair of conductive portions (68 and 70) on a pair of dielectric portions (72 and 74) lying on monocrystalline silicon (60). N-type dopant-containing ions are implanted into the silicon to form a pair of doped regions (78/82) separated by p-type material under one of the dielectric portions. Boron dopant-containing ions are similarly implanted to form a pair of doped regions (84) separated by n-type material under the other dielectric portion. A sacrificial oxidation is performed by oxidizing surface material of each conductive portion and each doped region and then removing at least part of the so oxidized material (86) down to the underlying silicon. Tungsten (88 and 90) is deposited on the exposed silicon after which a patterned electrical conductor is provided over the tungsten.

8 Claims, 4 Drawing Sheets

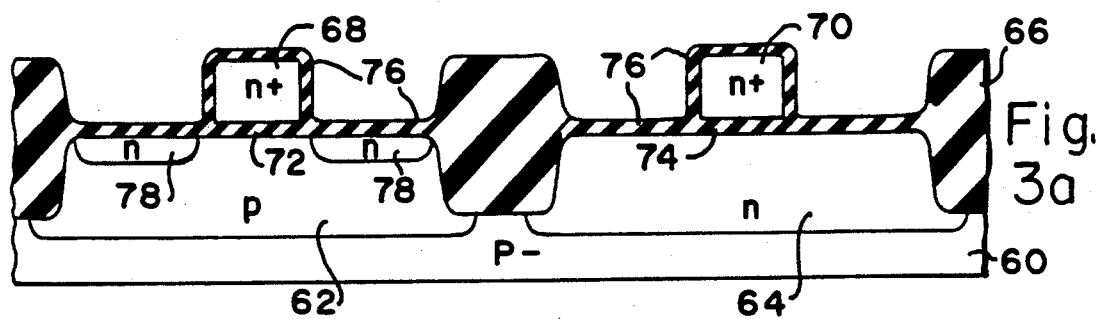
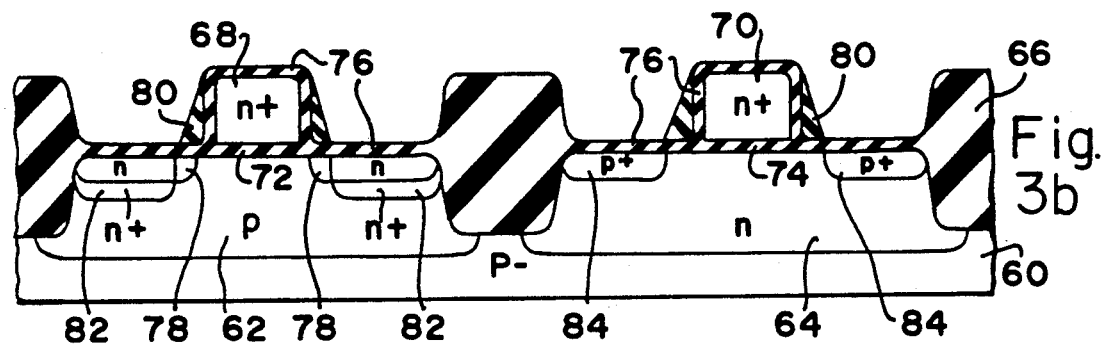
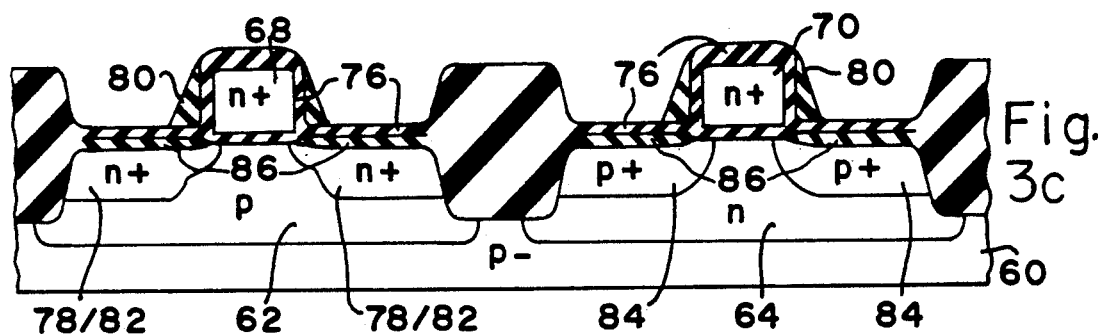
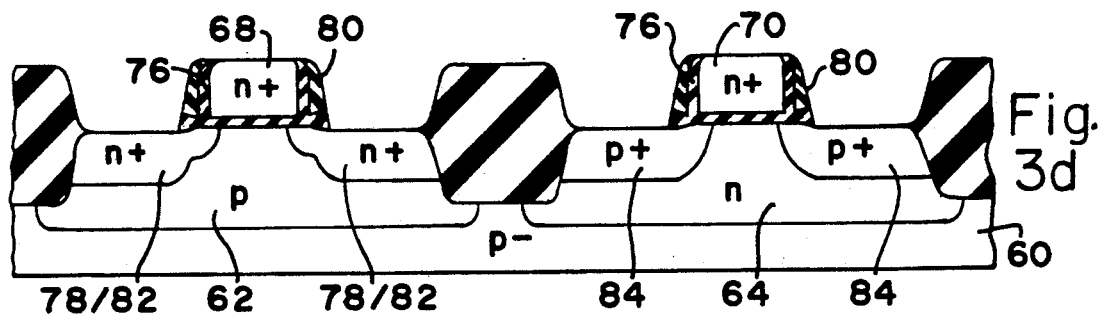
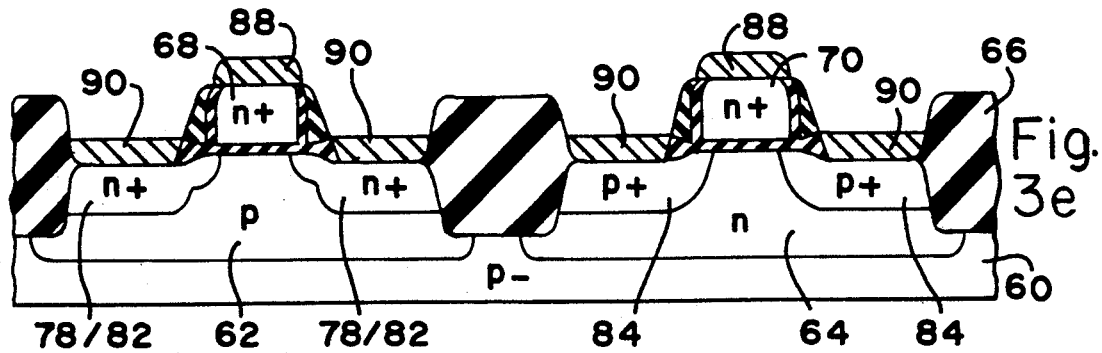

SEMICONDUCTOR FABRICATION PROCESS USING SACRIFICIAL OXIDATION TO REDUCE TUNNEL FORMATION DURING TUNGSTEN DEPOSITION

CROSS REFERENCE TO RELATED APPLICATION

This is a continuation of U.S. patent application Ser. No. 050,598, filed May 14, 1987 now abandoned.

FIELD OF USE

This invention relates generally to semiconductor processing technology and, in particular, to a method for alleviating tunnel formation during deposition of tungsten on monocrystalline silicon.

BACKGROUND ART

Tungsten is often used in fabricating a semiconductor integrated circuit (IC). In recent years, low-pressure chemical vapor deposition (LPCVD) techniques have been developed for depositing tungsten selectively on certain portions of an IC but not on others. See Broadbent et al, "Selective Low Pressure Chemical Vapor Deposition of Tungsten," *J. Electrochem. Soc.: Solid-State Sci. & Tech.*, June 1984, pp. 1427-1433. Also see Saraswat et al, "Selective CVD of Tungsten for VLSI Technology," *VLSI Sci. & Tech./1984*, Vol. 84-7, pp. 409-419. The ability to selectively deposit tungsten has significantly increased its usefulness, particularly in IC's of the complementary metal-oxide semiconductor (CMOS) type.

FIGS. 1a–1e show an example of how tungsten is so employed in manufacturing a p-channel insulated-gate field-effect transistor (FET) of a conventional CMOS-type IC. At the stage indicated in FIG. 1a, a thick field-oxide region 10 laterally surrounds part of a major n-type region 12 of a monocrystalline silicon substrate to define an active semiconductor island along the top of the substrate. An n-doped polycrystalline silicon (polysilicon) gate electrode 14 has been formed on a thin oxide dielectric layer 16 lying along the upper surface of n region 12.

Turning to FIG. 1b, a thin oxide layer 18 is grown from the exposed silicon in conjunction with the formation of oxide spacers 20 on portions of oxide layer 18 along the sides of electrode 14. Using field oxide 10 and the composite structure formed by electrode 14 and the surrounding oxide as a mask, ions 22 of a boron-containing species are implanted through layer 18 into n region 12 to form a pair of highly doped p-type regions 24 along the upper surface of the substrate.

The structure is then annealed in an inert high-temperature environment to activate the implanted boron and repair lattice damage. The implanted boron redistributes slightly during the anneal. As a result, p+ regions 24 expand downward and sideways as generally indicated in FIG. 1c to become the source/drain elements of the FET.

An electrical interconnection system for the various IC components is now formed. The portions of layer 18 along the tops of region 12 and electrode 14 are removed (except for the oxide under spacers 20) to expose the underlying silicon. See FIG. 1d. A selective tungsten deposition is performed by reducing tungsten hexafluoride under LPCVD conditions such that tungsten accumulates on the exposed silicon but not on the adjacent oxide. The result is the structure of FIG. 1e in which tungsten layers 26 and 28 respectively lie on elements 14 and 24. This structure is, for example, described in Metz et al, "Effect of Selective Tungsten as a Polysilicon Shunt on CMOS Ring-Oscillator Performance," *IEEE Electron Device Lett.*, July 1985, pp. 372-374. The interconnection system is finished by forming a patterned electrically conductive layer (not shown) that suitably contacts W layers 26 and 28.

The same steps are employed in forming an n-channel insulated gate FET in the CMOS-type IC, with two notable differences. Firstly, the monocrystalline silicon conductivities are reversed. Secondly, the source/drain elements of the n-channel FET are normally created by a double n-type ion implant typically consisting of a low dose of phosphorus and a high dose of arsenic. The phosphorus implant is performed before creating oxide spacers along the sides of the gate electrode. The boron implant to form p+ regions 24 of the p-channel FET follows both the arsenic implant and an anneal performed in a high-temperature oxidizing environment to activate the implanted arsenic. Part of the thickness of oxide layer 18 is produced by the silicon oxidized during this anneal.

One problem with selective deposition of tungsten onto monocrystalline silicon by LPCVD reduction of $WF_6$ is that "tunnels" are produced in the annealed silicon near the tungsten/silicon interface. The formation of these tunnels is described in: DeBlasi et al, "Interfacial Tunnel Structures in CMOS Source/Drain Regions Following Selective Deposition of Tungsten," presented at Mat. Res. Soc. Symp., Apr. 1986, published in *Mat. Res. Soc. Symp. Proc.*, Vol. 71, 1986, pp. 303-307; Stacy et al, "Interfacial Structure of Tungsten Layers Formed by Selective Low Pressure Chemical Vapor Deposition," *J. Electrochem. Soc.: Solid-State Sci. & Tech.*, Feb. 1985, pp. 444-448; and Paine et al, "Microstructural Characterization of LPCVD Tungsten Interfaces," presented at Mat. Res. Soc. Workshop, Oct. 1985, published in *Tungsten and Other Refractory Metals for VLSI*, 1986, pp. 117-123. Tunnels are a concern because they may detrimentally affect IC performance and/or reliability.

The location and number of tunnels seems to depend on the dose of the implanted species. With a low dose of arsenic or boron (or with no implantation at all), a large number of tunnels are produced in the annealed silicon near the periphery (or perimeter) of the W/Si interface. If the arsenic dose is high, few (if any) tunnels are produced. Conversely, a high boron dose leads to a very large number of tunnels. Furthermore, the tunnels are located along the entire extent of the W/Si interface, not just at the periphery.

High doses of arsenic and boron are normally employed in fabricating the source/drain elements of the CMOS-type IC described above. The problem of tunnel formation is thus particularly acute in the boron case.

The mechanism that causes tunnels is not well understood. Implantation of boron produces extended defects—i.e., dislocation loops and stacking faults—in the silicon near where the ions enter. However, the subsequent anneal eliminates virtually all the extended defects near the implantation surface. It appears that something besides extended defects must be responsible for the tunnels described in the preceding references. In any case, it is quite desirable to have a technique that lessens tunnel formation in boron-implanted silicon on which tungsten is selectively deposited.

GENERAL DISCLOSURE OF THE INVENTION

The present invention is a semiconductor fabrication process centering on a "sacrificial oxidation" performed on monocrystalline silicon between introduction of boron into the silicon and subsequent deposition of tungsten on the silicon. The "sacrificial oxidation" basically consists of growing an oxide from part of the silicon and then removing at least a portion of the so-grown oxide to expose the silicon where the tungsten is to be deposited. Use of the sacrificial oxidation substantially reduces tunnel formation during the tungsten deposition when the tungsten is provided by LPCVD from a tungsten halide such as tungsten hexafluoride.

More particularly, boron is introduced into part of a semiconductor body consisting substantially of monocrystalline silicon to form a primary doped region along a surface of the body. Material of the primary region along the surface is oxidized to create a sacrificial oxide layer. The thickness of the sacrificial layer is preferably 5–100 nanometers (nm). Material of the sacrificial layer is removed down to the remainder of the primary region to expose the underlying silicon. Tungsten is then deposited on the exposed silicon of the primary region.

The boron is typically introduced into the semiconductor body by implanting ions of a boron-containing species through the surface. In this case, the oxidizing step is performed at a temperature high enough to activate the implanted boron and repair lattice damage. The oxidation step is preferably done at 900°–1000° C. for a time of 5–30 minutes depending on the oxidation temperature.

The invention is particularly useful in manufacturing CMOS-type IC's of the type generally described above. Due to the reduced tunnel formation, the junction leakage current density in the resulting p-channel FET's is typically decreased at least two orders of magnitude. This improves reliability greatly.

BRIEF DESCRIPTION OF THE DRAWINGS

FIGS. 2d', 2e', 2f', and 2g' are cross-sectional structural side views illustrating alternative steps for continuing the fabrication of the structure of FIG. 2c in accordance with the invention.

FIGS. 3a, 3b, 3c, 3d, and 3e are cross-sectional structural side views illustrating steps in an application of the invention concepts of FIGS. 2a–2f to the manufacture of a CMOS-type IC.

Like reference symbols are employed in the drawings and in the description of the preferred embodiments to represent the same or very similar item or items.

DESCRIPTION OF THE PREFERRED EMBODIMENTS

FIGS. 2a–2f and 2d'–2g' illustrate the basic concepts of the invention. These figures show how a general semiconductor structure is fabricated using a sacrificial oxidation to alleviate tunnel formation during tungsten deposition on boron-implanted silicon. Conventional cleaning and photoresist masking techniques are employed in creating the various regions indicated in FIGS. 2a–2f and 2d'–2g'. References to the cleaning steps, to the steps involved in making photoresist masks, and to other such steps that are well known in the semiconductor art are omitted from the following description to simplify the discussion.

Figure 1A:
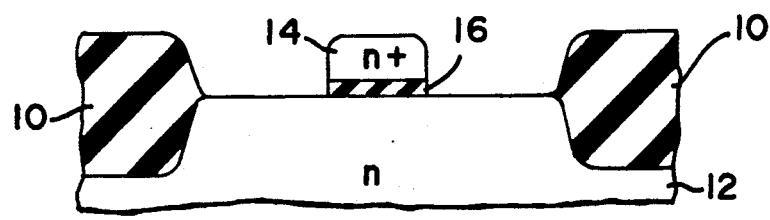
FIGS. 1a, 1b, 1c, 1d, and 1e are cross-sectional structural side views illustrating steps in fabricating a p-channel FET of a prior art CMOS-type IC.
Figure 1B:
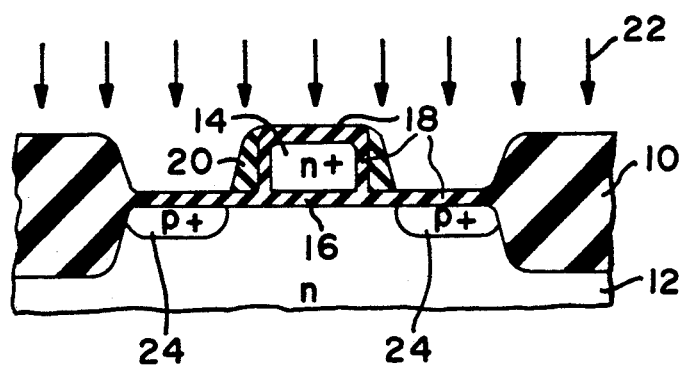
Figure 1C:
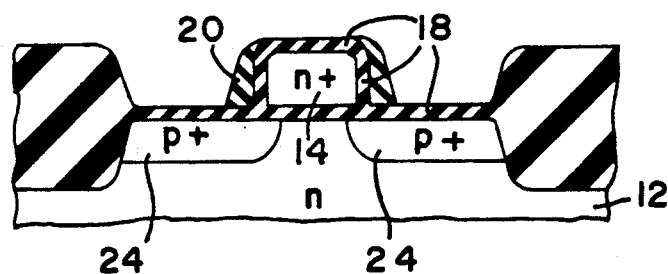
Figure 1D:
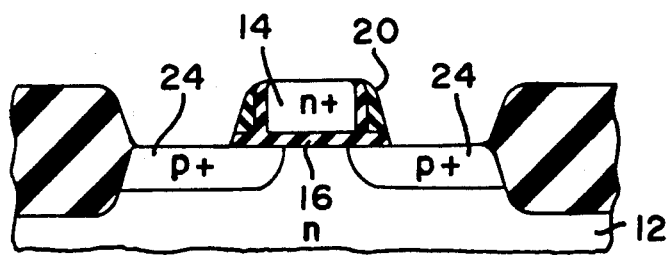
Figure 1E:
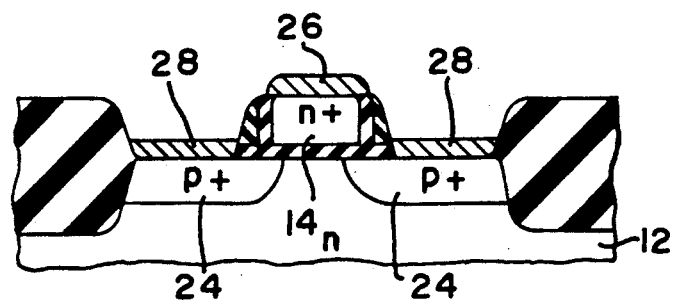
Figure 2A:
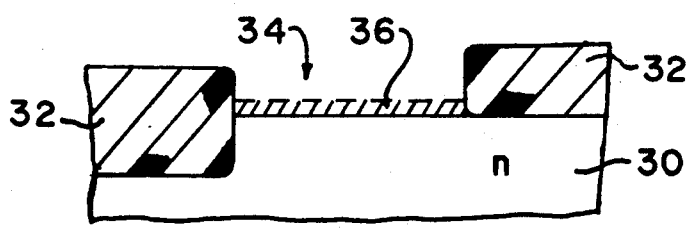
FIGS. 2a, 2b, 2c, 2d, 2e, and 2f are cross-sectional structural side views illustrating steps in manufacturing a semiconductor structure according to the invention.
Figure 2B:
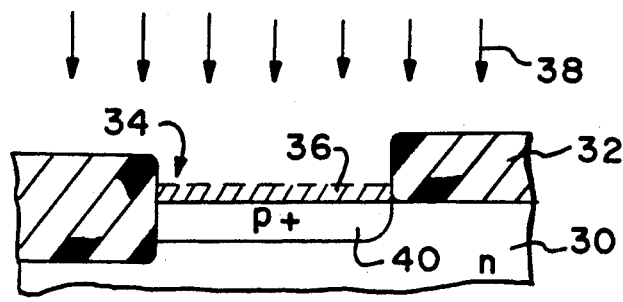

The starting point is a monocrystalline silicon semiconductor body having a major n-type region 30 as shown in FIG. 2a. The resistivity of n region 30 is 2–5 ohm-centimeters. An overstructure layer 32 fabricated in such a way as to be capable of acting as a boron implantation mask lies along the upper surface of region 30. An aperture 34 extends through layer 32. The portions of layer 32 in the vicinity of aperture 34 normally consist of electrically insulating material. The rest of layer 32 consists of either insulating material or a combination of insulating material and non-insulating material depending on the desired use of the final structure.

A thin layer 36 may cover the upper surface of n region 30 within aperture 34. The purpose of optional layer 36 is to minimize implanted ion channeling. If present, layer 36 typically consists of silicon dioxide having a thickness of 40–100 nm. Layer 36 may, however, consist of some other insulating material or even a non-insulating material.

Using layer 32 as a mask, ions 38 of a boron-containing species such as $B^+$ or $BF_2^+$ are implanted through layer 34 into region 30 to form a highly doped p-type region 40 along the upper surface of the semiconductor body. See FIG. 2b. Ions 38 pass through layer 36 if it is present. The implantation dose is in the range of $7 \times 10^{14}$ to $7 \times 10^{15}$ ions/cm$^2$ and is typically $1 \times 10^{15}$ ions/cm$^2$. When $B^+$ is the implanted species, the implantation energy is in the range of 1 to 60 kiloelectron volts (keV) and is typically 30 keV.

Figure 2C:
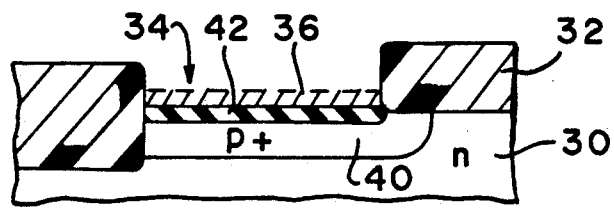

A sacrificial oxidation is initiated in the manner shown in FIG. 2c. A small thickness of the silicon in p+ region 40 located along the upper surface of the body and generally bounded by aperture 34 is thermally oxidized to form a sacrificial layer 42 of silicon dioxide having a thickness of 5–100 nm. The thickness of oxide layer 42 is preferably 15–30 nm. The oxidation is typically performed at atmospheric pressure in an environment of steam or dry oxygen. The oxidizing environment may also include a small fraction of a halogen-containing gas such as 1,1,1-trichloroethane or hydrochloric acid.

The oxidation step is performed at a temperature of at least 800° C. so as to activate the implanted boron and repair damage caused to the silicon lattice during the implantation. The oxidation is preferably done at 900°–1000° C. for 5–30 minutes depending on the oxidation temperature. However, the oxidation could be done by rapid thermal annealing for less than 1 minute at a temperature up to 1100° C. During the oxidation, the implanted boron redistributes in such a manner that p+ regions 40 extend downward and sideways to the positions indicated in FIG. 2c.

Figure 2D:
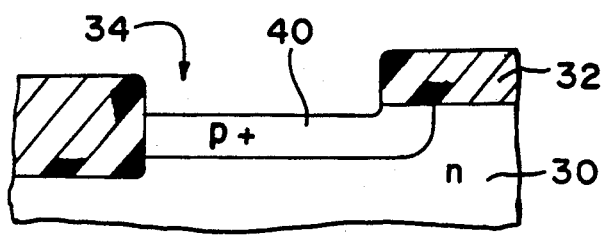
Figure 2E:
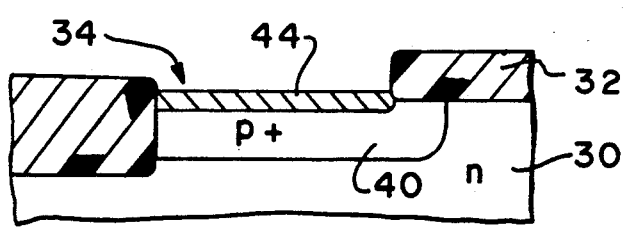
Figure 2F:
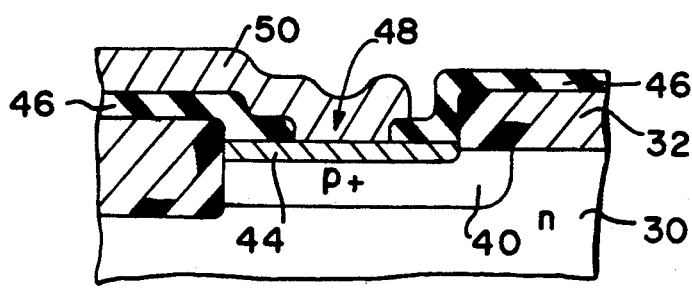
Figure 2D:
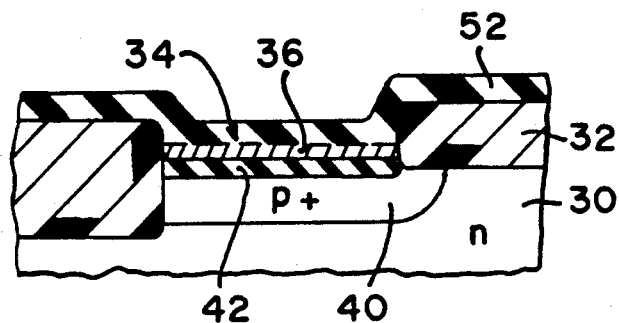
Figure 2E:
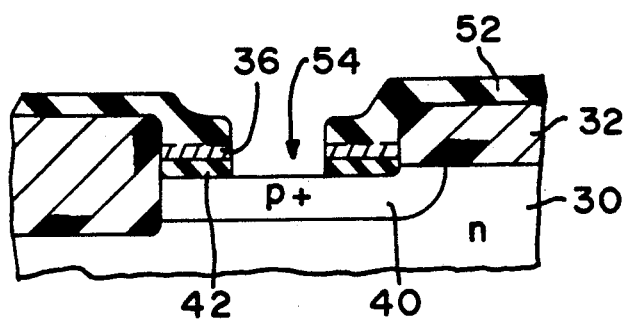
Figure 2F:
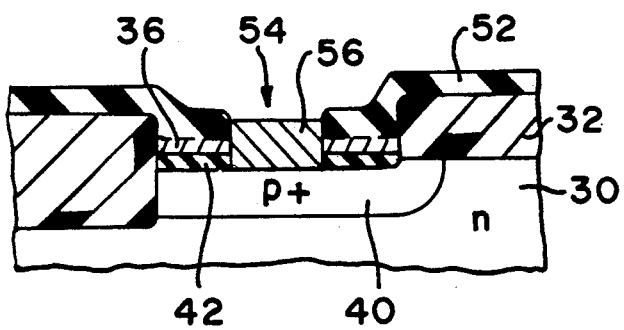

The sacrificial oxidation is completed either by removing substantially all of sacrificial layer 42 or by removing only a portion of layer 42 to expose the underlying silicon. FIGS. 2d–2f show an example of the further processing in which the first-mentioned way of completing the sacrificial oxidation is employed. FIGS. 2d'–2g' show an example of how the structure of FIG. 2c is further processed using the second way of finishing the sacrificial oxidation.

Looking first at FIGS. 2d–2f, all (or nearly all) of oxide layer 42 is removed with a suitable etchant such as buffered hydrofluoric acid to expose the underlying silicon of p+ region 40. See FIG. 2d. If present, layer 36 is removed prior to removing layer 42.

An interconnect system is now formed on the structure of FIG. 2d. Tungsten is deposited on the exposed silicon of p+ region 40 by reducing a tungsten halide under LPCVD conditions to form a layer 44 of tungsten having a minimum thickness of 10 nm. See FIG. 2e. The deposition is performed in a highly selective manner so that little (if any) tungsten accumulates on electrically insulating portions of overstructure layer 32. If any tungsten does accumulate on insulating material, a brief tungsten etch can be performed to remove this tungsten without significantly decreasing the thickness of W layer 44.

The tungsten deposition is preferably accomplished by reducing tungsten hexafluoride with hydrogen in a conventional manner such as that described in Broadbent et al or Saraswat et al, cited above. The $WF_6$ flow rate is 10–300 standard cm$^3$/minute (SCCM). The $H_2$ flow rate is 100–5,000 SCCM so as to achieve a $H_2/WF_6$ ratio of 10–100. Preferably, the $WF_6$ and $H_2$ flow rates are 2640 and 40 SCCM, respectively. The deposition pressure is less than 1 torr and is preferably 0.5 torr. The deposition temperature is in the range of 280°–600° C. and is preferably 300° C.

An examination was performed on samples of the structure of FIG. 2e in which n region 30 was (100) silicon. Layers 32 and 36 respectively consisted of 600 and 57 nm of thermally grown silicon dioxide. p+ region 40 was created by implanting $^{11}B+$ at 45 keV.

In one group of samples, the boron dose was $1 \times 10^{15}$ ions/cm$^2$. Layer 42 was grown to a thickness of 25 nm by oxidizing in steam at 900° C. for 7 minutes. About 11 nm of boron-implanted silicon were consumed during the oxidizing step. The thickness of W layer 44 was 34 nm. No tunnels were observed in this group of samples. If any tunnels were present, their length was less than 10 nm. A junction leakage current density of 0.3 nanoamperes/cm$^2$ was measured at 5 volts of reverse bias.

These results are in sharp contrast to those obtained with a group of samples processed in the same way as the foregoing group except that a conventional anneal at 900° C. for 30 minutes in an inert nitrogen environment was used instead of the sacrificial oxidation. Tunnels on the order of 100 nm in length were observed in the silicon along the entire tungsten/silicon interface in the conventionally-prepared group. At a reverse bias of 5 volts, the leakage current density for the conventional samples was 90 nanoamperes/cm$^2$—i.e., about 300 times that measured for the comparable samples prepared with the sacrificial oxidation of the invention.

Similar differences in tunnel formation were observed at higher boron doses of $3 \times 10^{15}$ and $6 \times 10^{15}$ ions/cm$^2$ (and correspondingly greater W thicknesses). Samples prepared according to the invention by oxidizing for 17 minutes at 900° C. in steam to produce layer 42 at a thickness of 52 nm were compared to conventional samples annealed for 30 minutes at 900° C. in nitrogen. The length of tunnels in the samples produced in accordance with the invention was on the order of 10 nm. For the conventionally-prepared samples, the tunnel length was approximately 100 nm, and the tunnel density was much greater. In short, the sacrificial oxidation of the invention leads to a very large decrease in tunnel formation during tungsten deposition.

Returning to the processing sequence, the manufacture of the interconnect system is completed in the conventional manner indicated in FIG. 2f. A layer 46 of electrically insulating material such as silicon nitride or silicon dioxide is plasma deposited on the top of the structure. Using a photoresist mask, insulation layer 46 is selectively etched to open a via 48 down to W layer 44. A patterned electrically conductive layer 50 that contacts layer 44 through via 48 is formed on the structure. Conductive layer 50 is created by depositing a blanket layer of a suitable electrically conductive material such as pure aluminum or an aluminum alloy and selectively etching the blanket layer through a photoresist mask to remove the undesired conductive material.

Next, consider the alternate set of steps shown in FIGS. 2d'–2g'. An electrically insulating layer 52 is deposited on layer 32 and into aperture 34 as depicted in FIG. 2d'. A contact opening 54 is etched through layers 52, 36 (if present), and 42 down to W layer 40 as illustrated in FIG. 2e'.

Figure 2G:
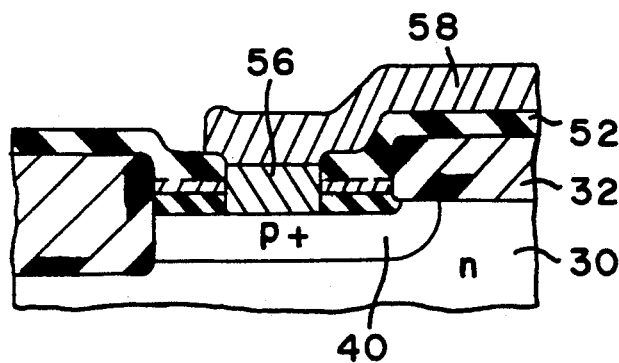

The interconnect system is now formed. Tungsten is selectively deposited into aperture 54 according to the above-described LPCVD conditions to form a tungsten layer 56 on the exposed silicon of p+ region 40. See FIG. 2f'. The interconnection system is completed by forming a patterned electrically conductive layer 58 that contacts W layer 56 as shown in FIG. 2g'.

FIGS. 3a–3e illustrate how the process of FIGS. 2a–2f is applied to the manufacture of an IC having a pair of complementary insulated-gate FET's. The starting point for this CMOS-type IC is a lightly doped p-type monocrystalline silicon substrate 60 having a p well 62 and an n well 64. See FIG. 3a. The sheet resistance of n well 64 is about 200 ohms/square. A field-oxide region 66 having a thickness of 600 nm laterally surrounds each of wells 62 and 64 to isolate them from each other and from other such wells along the surface of substrate 60.

A pair of n-doped polysilicon gate electrodes 68 and 70 about 500 nm in thickness have been formed respectively on thin oxide dielectric layers 72 and 74 lying respectively along the upper surfaces of wells 62 and 64. An oxide layer 76 having an average thickness of about 30 nm lies along the remaining surface portions of elements 62, 64, 68, and 70. Using field oxide 66 and the composite structure formed by electrode 68 and the surrounding oxide as a mask (in conjunction with a separate photoresist mask for n well 64), phosphorus has been implanted through oxide layer 76 into p well 62 at a low dose to form a pair of separated n-type regions 78.

Moving to FIG. 3b, oxide spacers 80 are formed on portions of oxide layer 76 along the sides of electrodes 68 and 70. The reference symbol "76" has been carried over to the thin oxide located in FIG. 3b in largely the same place as oxide layer 76 in FIG. 3a, even though parts of this oxide are actually reformed during spacer fabrication.

Using field oxide 66 and the composite structure formed by electrode 68 and the surrounding oxide including spacers 80 as a mask (along with a separate photoresist mask for n well 64), arsenic is implanted through oxide layer 76 into p well 62 at a high dose. The resulting highly doped n-type regions 82 partly overlap n regions 78. In a similar manner, $4 \times 10^{15}$ ions/cm$^2$ of boron in the form of B+ are implanted through layer 76 into n well 64 at 55 keV using field oxide 66 and the composite structure formed by electrode 70 and the surrounding oxide including spacers 80 as a mask (along with a separate photoresist mask for p well 62) to form a pair of highly doped p-type regions 84. The order in which these two implantations are performed is immaterial.

Next, sacrificial oxide layers 86 are thermally grown according to the above-mentioned conditions from the silicon below the portions of layer 76 along the upper surface of substrate 60. See FIG. 3c. Layers 86 are about 25 nm thick along p+ regions 84.

Redistribution of the implanted boron and arsenic during the oxidation causes p+ regions 84 and the composite n+ regions 78 and 82, now labeled as regions 78/82, to expand downward and sideways roughly to the positions indicated in FIG. 3c. Furthermore, both of the implanted species are activated as a result of the high oxidation temperature. Regions 78/82 become the source/drain elements for the n-channel FET. Regions 84 become the source/drain elements for the p-channel FET.

The portions of oxide layers 76 and 86 along the tops of elements 68, 78/82, 70, and 84 (excluding the oxide under spacers 80) are removed to expose the underlying silicon. See FIG. 3d.

The interconnect system is created at this point. Tungsten is selectively deposited according to the conditions given above to form tungsten layers 88 and 90 on the exposed silicon as shown in FIG. 3e. Manufacture of the interconnect system can now be continued in the manner described above for FIG. 2f.

While the invention has been described with reference to particular embodiments, this description is solely for the purpose of illustration and is not to be construed as limiting the scope of the invention claimed below. For example, the boron could be introduced into the semiconductor body by diffusion instead of ion implantation. The tungsten deposition could be performed under non-selective LPCVD conditions; an additional etching step might then be needed to remove tungsten that accumulates in undesired locations. The tungsten might be provided from a source other than a tungsten halide. It might be possible to eliminate insulation layer 52 in the alternative of FIGS. 2d'-2g'. Thus, various modifications, changes, and applications may be made by those skilled in the art without departing from the true scope and spirit of the invention as defined by the appended claims.

We claim:

1. A method in which first and second electrically conductive portions are formed respectively on first and second dielectric portions lying on a surface of a semiconductor body consisting substantially of monocrystalline silicon; ions of at least one species containing n-type dopant are selectively implanted through the surface into p-type material of the body to form a pair of first doped regions separated by p-type material underlying the first dielectric portion; ions of at least one species containing boron are selectively implanted through the surface into n-type material of the body to form a pair of second doped regions separated by n-type material underlying the second dielectric portion; tungsten is deposited on exposed silicon of the doped regions and on exposed material of the conductive portions to form at least one tungsten layer; and a patterned electrically conductive layer is provided over at least part of each tungsten layer so as to contact it; characterized in that a sacrificial oxidation is performed after both implanting steps but before the depositing step in order to substantially reduce tunnel formation during the depositing step, the sacrificial oxidation comprising the steps of:

oxidizing material of each doped region along the surface to create a sacrificial oxide layer; and
removing material of each sacrificial layer down to the remainder of its doped region to expose underlying silicon.

2. A method as in claim 1 characterized in that each of the sacrificial layers along the second doped regions has a thickness of 5-100 nm.

3. A method as in claim 2 characterized in that the thickness of the sacrificial layers along the second doped regions is 15-30 nm.

4. A method as in claim 2 characterized in that the oxidizing step is performed in an environment consisting at least partially of steam or dry oxygen.

5. A method as in claim 4 characterized in that the oxidizing step is performed at a temperature sufficiently high to activate the n-type dopant and boron implanted into the doped regions during the implanting steps, whereby the first doped regions become n-type source/drain elements and the second doped regions become p-type source/drain elements.

6. A method as in claim 5 characterized in that the temperature is 900°-1000° C.

7. A method as in claim 6 characterized in that the oxidizing step is performed for a time of 5-30 minutes.

8. A method as in claim 1 wherein the depositing step is performed by low-pressure chemical vapor deposition of tungsten from tungsten hexafluoride.

* * * * *